United States Patent
Lee (10) Patent No.: US 7,723,151 B2
(45) Date of Patent: May 25, 2010

(54) CMOS IMAGE SENSOR AND METHOD FOR FABRICATING THE SAME

(75) Inventor: Kae Hoon Lee, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 1082 days.

(21) Appl. No.: 11/268,548

(22) Filed: Nov. 8, 2005

(65) Prior Publication Data

US 2006/0097297 A1 May 11, 2006

(30) Foreign Application Priority Data

Nov. 9, 2004 (KR) .................. 10-2004-0090796

(51) Int. Cl.
*H01L 31/14* (2006.01)
(52) U.S. Cl. ........... 438/71; 257/E31.121; 257/E21.249
(58) Field of Classification Search .............. 438/27, 438/65–66, 69–71; 257/294, 436, E31.121, 257/E21.249
See application file for complete search history.

(56) References Cited

U.S. PATENT DOCUMENTS 5,670,384 A * 9/1997 Needham .................. 438/70
6,849,350 B2 * 2/2005 Minami et al. ............ 428/701
6,979,588 B2 * 12/2005 Jeong et al. ................ 438/70
2005/0139832 A1 * 6/2005 Jeon ......................... 257/69
2005/0274968 A1 * 12/2005 Kuo et al. .................. 257/98
2006/0198008 A1 * 9/2006 Li et al. ..................... 359/227

FOREIGN PATENT DOCUMENTS

| JP | 2003-287603 A | 10/2002 |
| KR | 10-2001-0047339 A | 6/2001 |
| KR | 10-2002-0042963 A | 6/2002 |
| KR | 10-2002-0045162 A | 6/2002 |

* cited by examiner

*Primary Examiner*—Lynne A Gurley
*Assistant Examiner*—Colleen A Matthews
(74) *Attorney, Agent, or Firm*—McKenna Long & Aldridge LLP

(57) ABSTRACT

A CMOS image sensor and fabricating method thereof enhances a light-receiving capability of an image sensor by preventing poor light-refraction characteristics at the peripheral part of a microlens. The CMOS image sensor includes at least one microlens formed by anistropic etching to have a focusing centerline, a central lens portion, and a peripheral lens portion, wherein the focusing centerline passes through the central lens portion and wherein the peripheral lens portion surrounds the central lens portion. The central lens portion has a first convex curvature based on a first radius and the peripheral lens portion has second convex curvature based on a second radius, wherein the second radius is greater than the first radius.

9 Claims, 7 Drawing Sheets

CMOS IMAGE SENSOR AND METHOD FOR FABRICATING THE SAME

This application claims the benefit of Korean Patent Application No. 10-2004-0090796, filed on Nov. 9, 2004, which is hereby incorporated by reference for all purposes as if fully set forth herein.

BACKGROUND OF THE INVENTION

1. Field of the Invention

The present invention relates to a CMOS image sensor and a method for fabricating the same. The present invention is suitable for a wide scope of applications, and is particularly suitable for enhancing a light-receiving capability of the image sensor.

2. Discussion of the Related Art

Image sensors are semiconductor devices for converting an optical image into an electrical signal and include charge-coupled devices and complementary metal-oxide-semiconductor (CMOS) image sensors. A general charge-coupled device includes an array of photodiodes that convert light signals into electrical signals. Disadvantages of a general charge-coupled device include a complicated driving method, high power consumption, and a complicated fabrication process requiring a multi-phased photo process. In a charge-coupled device, integration of complementary circuitry such as a control circuit, a signal processor, and an analog-to-digital converter into a single-chip device is difficult. Thus, development of compact-sized or thin products is hindered. Examples of compact-sized or thin products that use such image sensors include digital still cameras and digital video cameras.

CMOS image sensors, on the other hand, adopt CMOS technology that employs a control circuit and a signal processing circuit as a peripheral circuit. CMOS image sensors also adopt switching technology that allows outputs to be sequentially detected using MOS transistors provided to correspond to a number of arrayed pixels, thereby detecting an image. Accordingly, a CMOS image sensor uses CMOS fabrication technology, i.e., a simple fabrication method using fewer photolithography steps, that enables an advantageous device exhibiting low power consumption.

In a CMOS image sensor of the related art, a photodiode is the active device that forms an optical image based on incident light signals by generating electrical signals according to the intensity and wavelength or color of incident light. In such a CMOS image sensor, each photodiode senses incident light and the corresponding CMOS logic circuit converts the sensed light into an electrical signal according to input wavelength. The photosensitivity of the photodiode increases as more light is able to reach the photodiode. In this instance, enhanced photosensitivity results from an increase in the levels of sensed light and corresponds to the light-receiving capability of the active device. One way of enhancing the photosensitivity of a CMOS image sensor is to improve its fill factor. The fill factor is the degree of surface area covered by the photodiodes versus the entire surface area of the image sensor. The fill factor is improved by increasing the area responsive to incident light, i.e., the photo-sensing portion. However, there is a limit to increasing the photo-sensing portion due to the required presence of the logic circuit portion.

Therefore, a device including a material exhibiting excellent light transmittance, such as a convex microlens having a predetermined curvature for refracting incident light, may be provided to redirect any light that may be incident on the image sensor outside the immediate area of the photodiodes. The convex microlens having the predetermined curvature concentrates or focuses the incident light on one or more of the photodiodes themselves. That is, the incident light, striking the surface of the convex structure of the microlens while in parallel to the optical axis of the microlens, is refracted by the microlens according to the curvature of the convex microlens. This refraction allows the incident light to become focused at a predetermined point along the optical axis. Accordingly, in a color image sensor, such a microlens may be provided over a color filter layer including red (R), blue (B), and green (G) color filter elements for passing the light of each wavelength or color to a photodiode area.

Meanwhile, CMOS image sensors are classified according to a number of transistors. For example, a 3T-type CMOS image sensor consists of one photodiode and three transistors, and a 4T-type CMOS image sensor consists of one photodiode and four transistors. An equivalent circuit and layout of a unit pixel of a general 3T-type CMOS image sensor are shown in FIG. 1 and FIG. 2, respectively.

Figure 1:
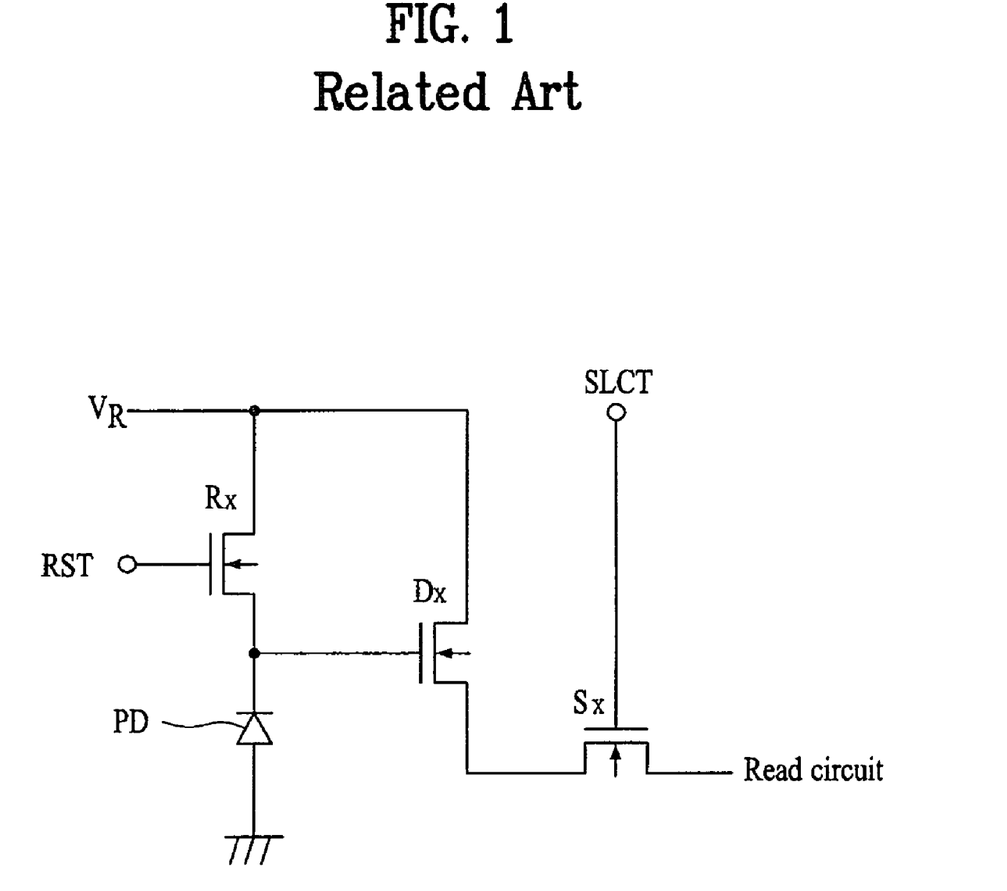
FIG. 1 is a diagram of an equivalent circuit of a 3T-type CMOS image sensor of the related art.

Referring to FIG. 1, a CMOS image sensor of the related art comprises one photodiode PD and three NMOS transistors, including a reset transistor Rx, a drive transistor Dx, and a select transistor Sx. The cathode of the photodiode PD is commonly connected to the drain of the reset transistor Rx and the gate of the drive transistor Dx. The drain of the driver transistor Dx is connected to the source of the select transistor Sx, whose drain is in turn connected to a read circuit. With the anode of the photodiode PD grounded, a reference voltage $V_R$ is applied via a power line to the source of each of the reset transistor Rx and the drive transistor Dx. A reset signal RST is applied via a reset line to the gate of the reset transistor Rx, and a select signal SLCT is applied via a column select line to the gate of the select transistor Sx.

Figure 2:
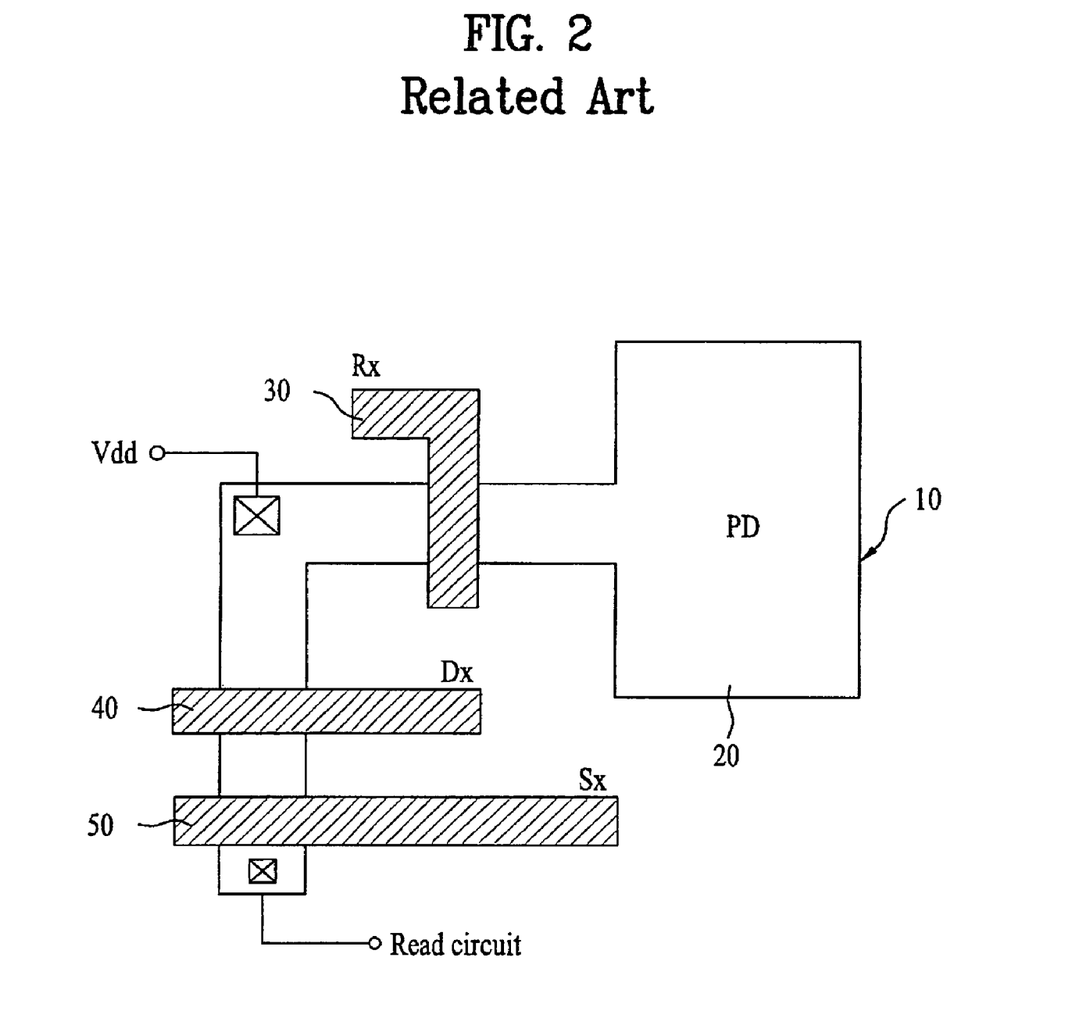
FIG. 2 is a layout of a unit pixel of a 3T-type CMOS image sensor of the related art.

Referring to FIG. 2, an active area 10 is defined for each unit pixel of the CMOS image sensor of FIG. 1. The active area 10 includes a photodiode area 20 comprising the bulk of the active area 10, which is overlapped by gate electrode areas 30, 40, and 50 of the three NMOS transistors, respectively. The source/drain region of each transistor is formed by performing an ion-implantation process with respect to the active area 10. Power (Vdd) is applied to the source/drain regions of the reset transistor Rx and the drive transistor Dx. The source/drain region of the select transistor Sx is connected to the read circuit, and each of the gate electrodes 30, 40, and 50 is connected to external circuitry (not shown) via a corresponding signal line having a pad provided at one end.

Figure 3:
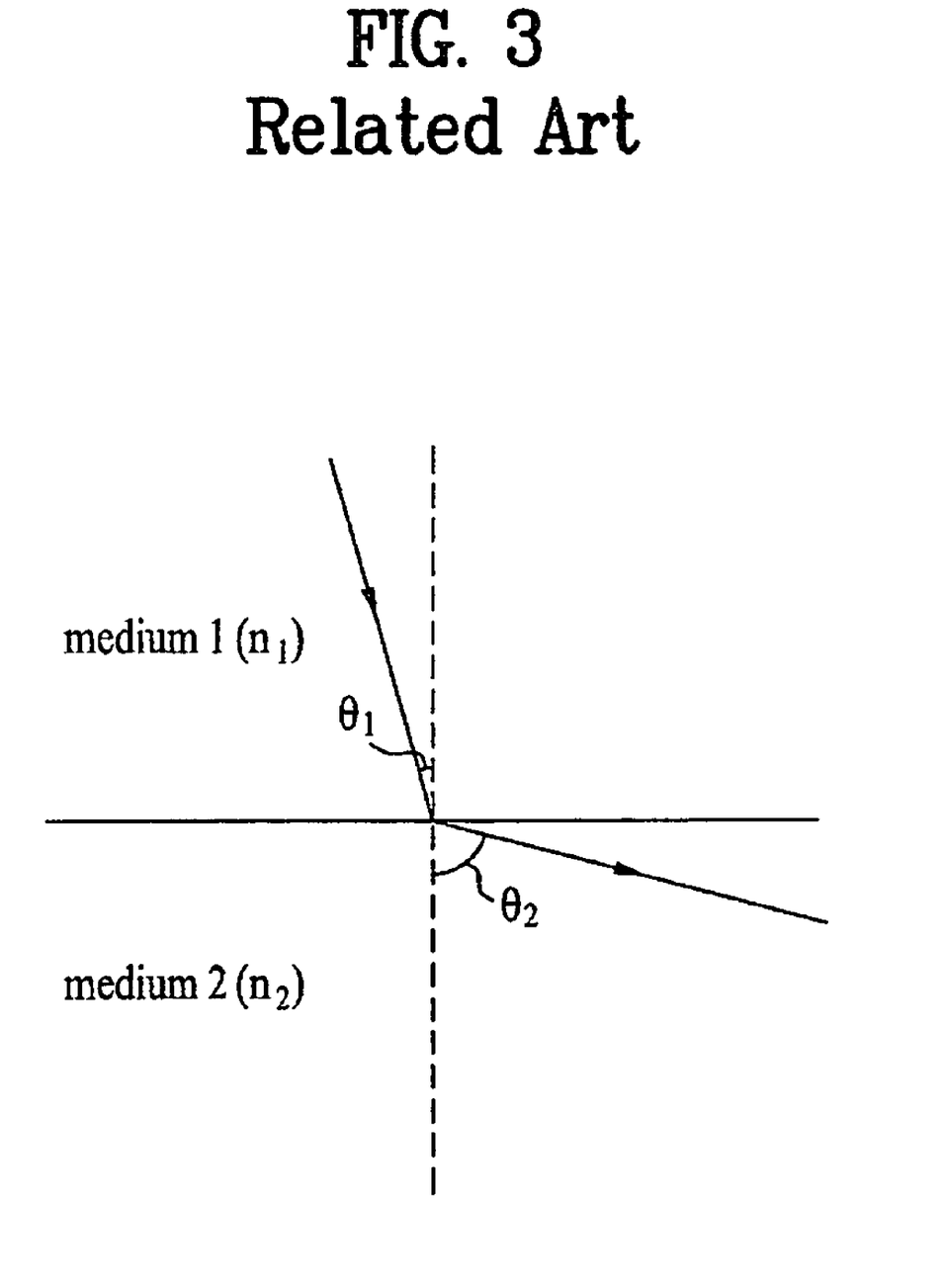
FIG. 3 is a diagram of the incidence of light at the juncture of dissimilar media to illustrate an optical refractive law.

FIG. 3 diagrams the incidence of light at the juncture of dissimilar media, i.e., media exhibiting different densities, including a first medium 1 having a refraction index $n_1$ and a second medium 2 having a refraction index $n_2$. Incident light travels in the first medium 1 at an angle of incidence $\theta_1$ and then enters the second medium 2, and travels in the second medium 2 at an angle of refraction $\theta_2$. According to an optical refractive law:

$$n_1 \times \sin\theta_1 = n_2 \times \sin\theta_2$$

$$n_1/n_2 = \sin\theta_2/\sin\theta \text{hd } 1$$

for a first medium (e.g., air) that is optically less dense than a second medium (e.g., a lens). Therefore, by using a lens material exhibiting a high refractivity to reduce total reflection occurring near a perimeter of a microlens, that is, light incident nearer the perimeter or in a peripheral area of the microlens, the angle of refraction increases for greater angles of incidence. Thus, the intensity of focused light is increased.

Figure 4:
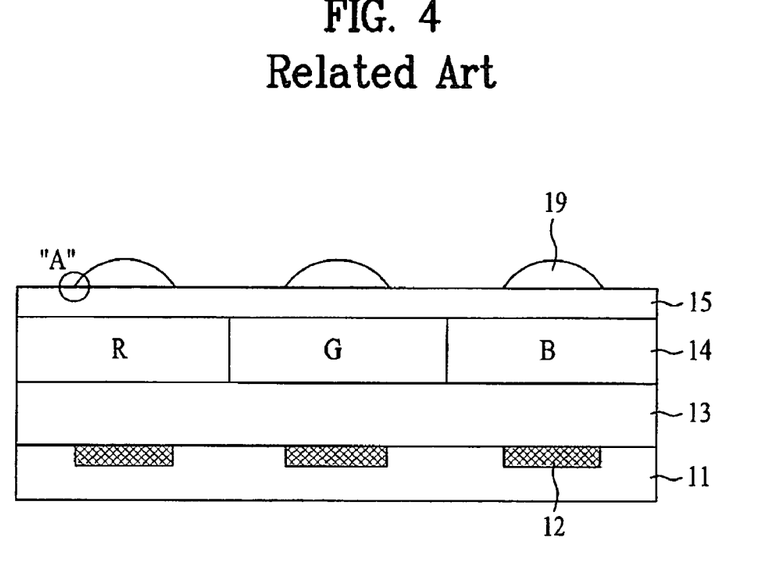
FIG. 4 is a cross-sectional diagram of a CMOS image sensor of the related art.

Referring to FIG. 4, illustrating a CMOS image sensor and a method for forming a microlens thereof according to the related art, at least one photodiode 12 for generating an electrical charge according to the intensity of an incoming light signal is formed in a predetermined surface of a semiconductor substrate 11. An insulating interlayer 13 is formed on the semiconductor substrate 11 including the photodiodes 12. A color filter layer 14 includes a plurality of color filters, such as red (R) green (G), and blue (B) color filters, and is formed on the insulating interlayer 13 to transmit light according to its wavelength or band. The color filters are arranged to correspond to the photodiodes 12. A planarizing layer 15 is formed on the color filter layer 14. At least one microlens 19 is formed on the planarizing layer 15 as an array of microlenses corresponding to the at least one photodiode 12. Each microlens 19 is formed by depositing, patterning, and reflowing a photoresist to have a convex structure with a predetermined curvature for concentrating light onto one photodiode 12 via a corresponding color filter of the color filter layer 14. Structural characteristics of the microlens 19, including its curvature and height, are determined in accordance with various device factors such as focal length, specific photodiode arrangement, color filter size, etc.

Figure 5:
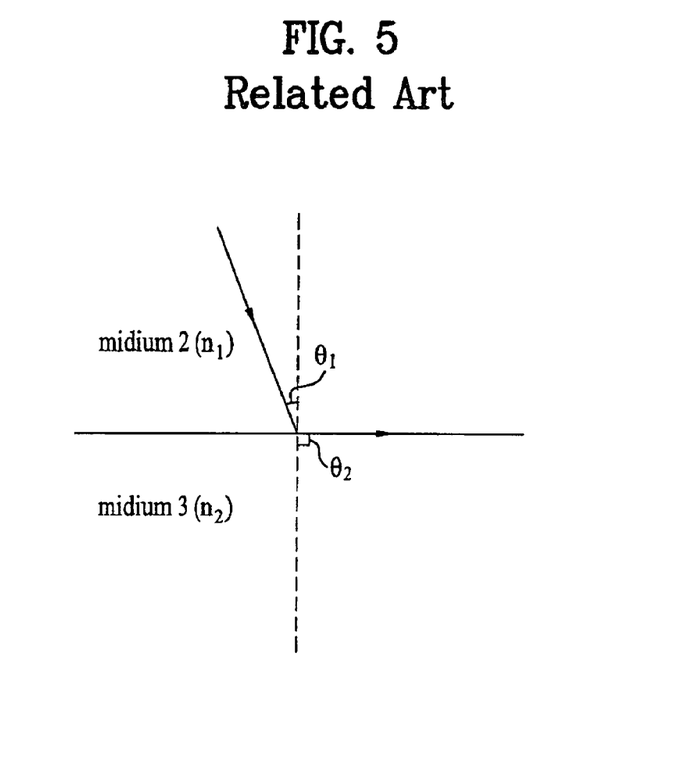
FIG. 5 is a diagram illustrating an optical phenomenon of the incidence of light occurring near a microlens perimeter of the CMOS image sensor shown in FIG. 4.

FIG. 5 diagrams the incidence of light at the juncture of dissimilar media to illustrate an optical phenomenon of light incident near a microlens perimeter A of the CMOS image sensor shown in FIG. 4. As shown, when light enters a medium 3, namely, a surface of the planarizing layer 15, which is a relatively sparse medium optically, from the more dense medium 2 at increased angles of incidence near the microlens perimeter A, the refracted ray tends to travel along the surface of medium 3. Thus, the total refracted light, incoming via the microlens 19, is inefficiently focused on the photodiode 12. This prevents an optimum quantity of light from reaching the photodiode.

SUMMARY OF THE INVENTION

Accordingly, the present invention is directed to a CMOS image sensor and a method for fabricating the same that substantially obviates one or more problems due to limitations and disadvantages of the related art.

An advantage of the present invention is to provide a CMOS image sensor and a method for fabricating the same, which enhances the light-receiving capability of an image sensor by configuring a microlens to comprise central and peripheral parts. Each of the central and peripheral parts are imparted with a predetermined convex curvature to maximize light transmitted to an active device for generating an electrical charge according to the intensity of an incoming light signal.

Additional features and advantages of the invention will be set forth in the description which follows, and in part will be apparent from the description, or may be learned by practice of the invention. The objectives and other advantages of the invention will be realized and attained by the structure and method particularly pointed out in the written description and claims hereof as well as the appended drawings.

To achieve these and other advantages and in accordance with the purpose of the present invention, as embodied and broadly described, there is provided a CMOS image sensor comprising at least one microlens formed by anisotropic etching to have a focusing centerline, a central lens portion, and a peripheral lens portion, wherein the focusing centerline passes through the central lens portion and wherein the peripheral lens portion surrounds the central lens portion.

In another aspect of the present invention, there is provided a method of fabricating a CMOS image sensor. The method comprises forming at least one photodiode in a predetermined surface of a semiconductor substrate; forming a color filter layer over the semiconductor substrate including the at least one photodiode, the color filter layer having at least one color filter arranged corresponding to the at least one photodiode; forming a planarizing layer over the semiconductor substrate including the color filter layer; forming, on the planarizing layer, a first insulating layer to have a microlens pattern according to an arrangement of the at least one color filter; forming, on the planarizing layer, a second insulating layer to have a sidewall pattern disposed along lateral sides of the microlens pattern; and forming at least one microlens by an anisotropic etching of the microlens pattern and the sidewall pattern to have a focusing centerline, a central lens portion, and a peripheral lens portion, wherein the focusing centerline passes through the central lens portion and wherein the peripheral lens portion surrounds the central lens portion.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiment(s) of the invention and together with the description serve to explain the principles of the invention. In the drawings.

DETAILED DESCRIPTION OF THE INVENTION

Reference will now be made in detail to embodiments of the present invention, examples of which are illustrated in the accompanying drawings. Wherever possible, like reference designations will be used throughout the drawings to refer to the same or similar parts.

Figure 6A:
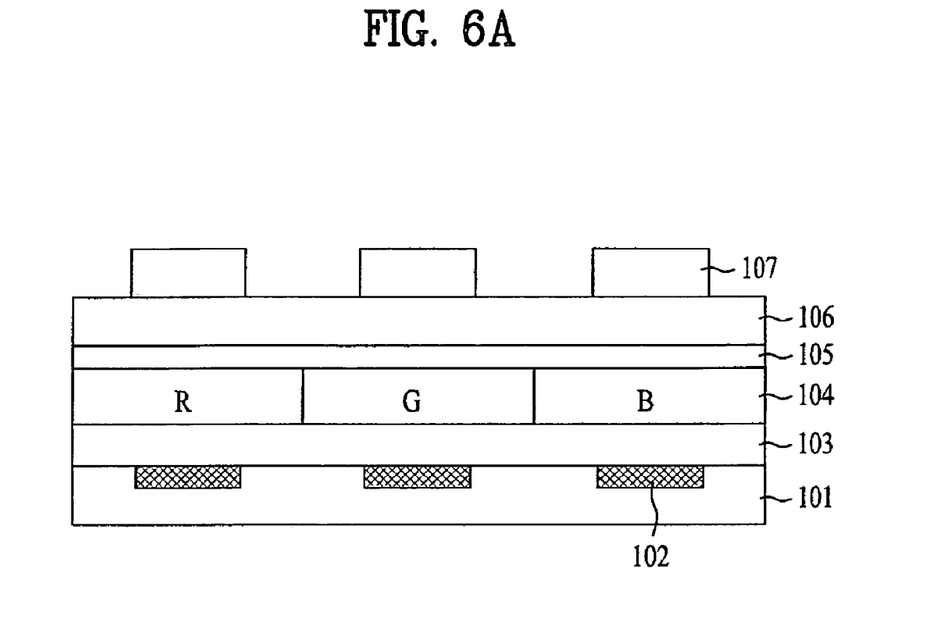
FIGS. 6A-6E are cross-sectional diagrams illustrating a method of fabricating a CMOS image sensor according to the present invention.

Referring to FIG. 6A, an insulating interlayer 103 is formed on a semiconductor substrate 101 having at least one photodiode 102 formed in a predetermined surface of the semiconductor substrate. Each photodiode is configured with various transistors (not shown) and a unit pixel of the CMOS image sensor is formed. Photodiodes 102 are active devices for generating an electrical charge according to the intensity of an incoming light signal and may be a photo-gate type device. The insulating interlayer 103 may include an optical shielding layer (not shown) to prevent light from entering a substrate area other than at one of the photodiodes 102. A color filter layer 104, comprised of an array of red (R), green (G), and blue (B) color filters, is formed on the insulating interlayer 103, such that the color filters are arranged at a predetermined interval to be respectively disposed above the photodiodes 102. The color filter layer 104 is formed as a single layer for filtering light according to wavelength band. The color filter layer 104 is formed by coating the insulating interlayer 103 with a photosensitive material to a thickness of 1~5 μm for each color filter and patterning the respective coatings of photosensitive material by photolithography using a separate mask. Subsequently, a planarizing layer 105 is formed over the semiconductor substrate 101 including the color filter layer 104. A first insulating layer 106 is then formed on the planarizing layer 105 to a thickness of 3,000~6,000 Å. First insulating layer 106 may be formed of a material exhibiting a light transmissivity higher than that of a related art microlens, for example, germanium oxide ($GeO_2$) or boron oxide ($B_2O_3$). The first insulating layer 106 will serve to form the major portion of each of a plurality of microlenses. A photoresist is coated on the first insulating layer 106 and then patterned, by exposure and development, according to the arrangement of the plurality of microlenses, to form a photoresist pattern 107.

Figure 6B:
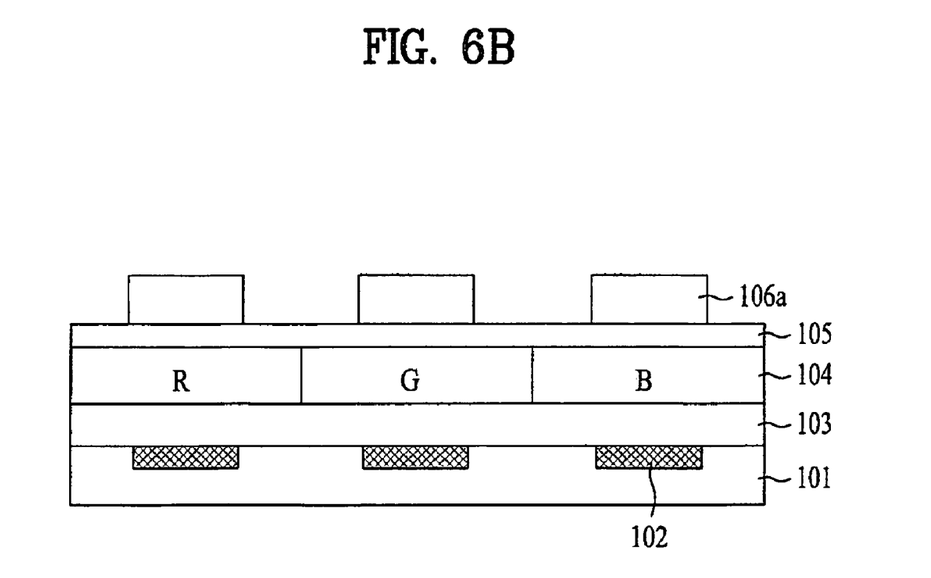

Referring to FIG. 6B, the first insulating layer 106 is selectively patterned by dry etching using the photoresist pattern 107 as a mask to form a first insulating layer pattern 106a. After removing the photoresist pattern 107, particles generated in forming the first insulating layer pattern 106a are removed by ashing and cleaning.

Figure 6C:
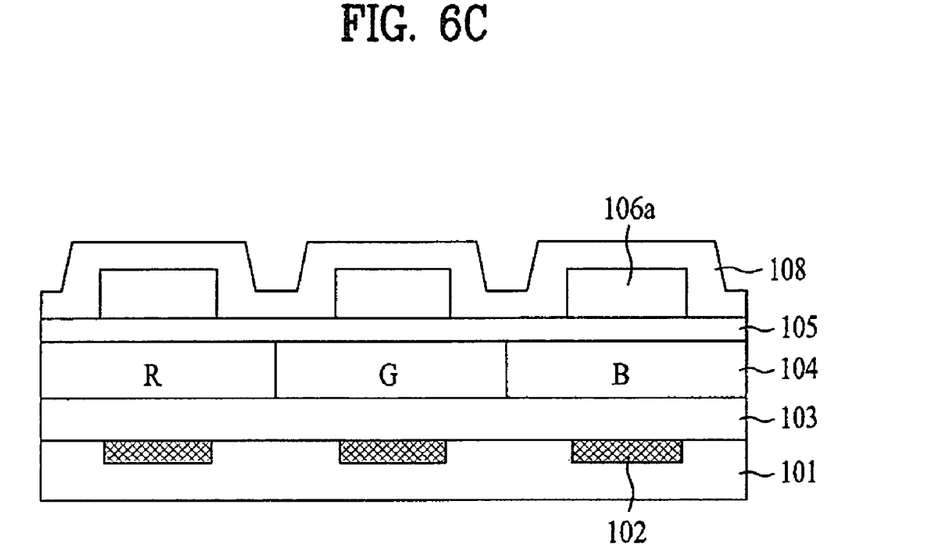

Referring to FIG. 6C, a second insulating layer 108 of, for example, silicon dioxide ($SiO_2$), is formed to a thickness of 2,000~5,000 Å over the semiconductor substrate 101 including the first insulating layer pattern 106a. The second insulating layer 108 will serve to form a minor portion of each of the plurality of microlenses. Accordingly, the first insulating layer 106, which should be formed at least 2,000 Å thicker than the second insulating layer 108, has a thickness to impart each microlens with a convex curvature radius greater than that achieved by the second insulating layer 108. Also, the material of the first insulating layer 106 exhibits a higher light transmissivity than that of the second insulating layer 108.

Figure 6D:
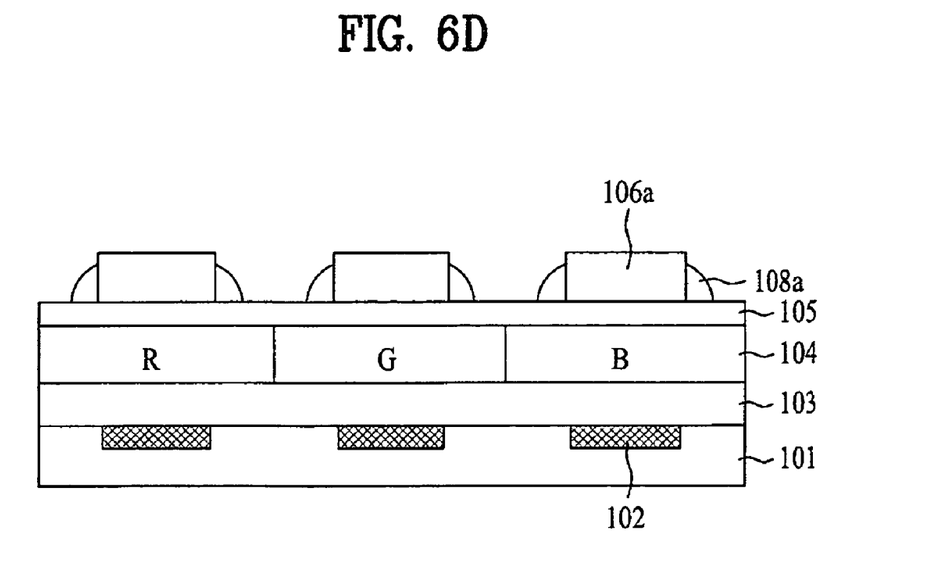

Referring to FIG. 6D, an etch-back process is carried out on the second insulating layer 108 to form a second insulating layer sidewall 108a on a lateral side of the first insulating layer pattern 106a.

Figure 6E:
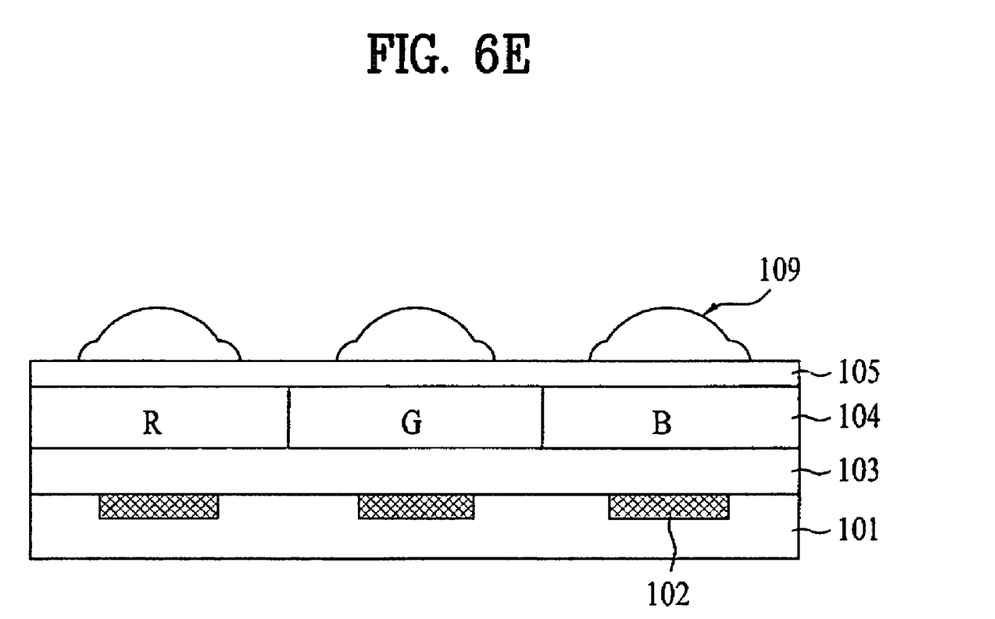

Referring to FIG. 6E, the second insulating layer sidewall 108a and the first insulating layer pattern 106a are anisotropically etched to form a plurality of microlenses 109. In the microlens 109, since the first insulating layer pattern 106a is thicker than the second insulating layer sidewall 108a, a peripheral part can have a convex structure smaller than that of a central part. The peripheral part corresponds to the above-mentioned minor part of each microlens 109 and constitutes a peripheral lens portion. The central part corresponds to a major part of each microlens and constitutes a central lens portion where the focusing centerline of the microlens occurs. Thus, the central lens portion has a first height and a first width determined by the deposition and patterning of the first insulating layer 106, and the peripheral lens portion has a second height and a second width determined by the deposition and etching of the second insulating layer 108. The ratio of the first height to the second height is at least 1:0.5 and the ratio of the first width to the second width is at least 1:0.5. The above structural relationship between the first insulating layer pattern 106a and the second insulating layer sidewall 108a enables the anisotropic etching step to form the central and peripheral parts of the microlens 109 as a microlens pattern and a sidewall pattern, respectively.

Accordingly, a CMOS image sensor according to the present invention is shown in FIG. 6E. That is, the CMOS image sensor of the present invention comprises the semiconductor substrate 101; the at least one photodiode 102 formed in a predetermined surface of the semiconductor substrate 101 to be disposed corresponding to the at least one microlens 109; the insulating interlayer 103 formed on the semiconductor substrate 101 including the photodiode 102; the color filter layer 104 having at least one color filter arranged corresponding to the at least one photodiode 102; and the planarizing layer 105, for receiving the at least one microlens 109, formed over the semiconductor substrate 101 including the color filter layer 104. The at least one microlens 109 is formed by anisotropic etching to have a focusing centerline, a central lens portion, and a peripheral lens portion, wherein the focusing centerline passes through the central lens portion and wherein the peripheral lens portion surrounds the central lens portion. The central lens portion has a first convex curvature based on a first radius, and the peripheral lens portion has a second convex curvature based on a second radius, which is greater than the first radius.

By adopting the CMOS image sensor and the method for fabricating the same according to the present invention, a light-receiving capability of the image sensor is enhanced by preventing poor light-refraction characteristics at the peripheral part of a microlens to thereby transmit a maximum-intensity light signal based on the light entering the microlens.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of fabricating a CMOS image sensor, comprising:

forming at least one photodiode in a predetermined surface of a semiconductor substrate;

forming a color filter layer over the semiconductor substrate including the at least one photodiode, the color filter layer having at least one color filter arranged corresponding to the at least one photodiode;

forming a planarizing layer over the semiconductor substrate including the color filter layer;

forming, on the planarizing layer, a first insulating layer to have a microlens pattern according to an arrangement of the at least one color filter;

forming, on the planarizing layer, a second insulating layer to have a sidewall pattern disposed along lateral sides of the microlens pattern; and forming at least one microlens by an anisotropic etching of the microlens pattern and the sidewall pattern to have a focusing centerline, a central lens portion, and a peripheral lens portion, wherein the focusing centerline passes through the central lens portion and wherein the peripheral lens portion surrounds the central lens portion, wherein the peripheral lens portion has a convex structure smaller than a convex structure of the central lens portion, wherein the central lens portion has a first convex curvature and the peripheral lens portion has a second convex curvature, wherein the first convex curvature has a first radius, the second convex curvature has a second radius, and the first radius is greater than the second radius.

2. The method of claim 1, wherein the first insulating layer is formed of one of germanium oxide ($GeO_2$) and boron oxide ($B_2O_3$).

3. The method of claim 1, wherein the second insulating layer is formed of silicon dioxide ($SiO_2$).

4. The method of claim 1, wherein the first insulating layer exhibits a first light transmissivity and wherein the second insulating layer exhibits a second light transmissivity.

5. The method of claim 4, wherein the first light transmissivity is greater than the second light transmissivity.

6. The method of claim 1, wherein the first insulating layer is formed to have a thickness of 3,000~6,000 Å.

7. The method of claim 6, wherein the microlens pattern is formed by photolithography using a photoresist pattern formed on the first insulating layer according to an arrangement of the at least one microlens.

8. The method of claim 1, wherein the second insulating layer is formed over the semiconductor substrate including the microlens pattern to have a thickness of 2,000~5,000 Å.

9. The method of claim 8, wherein the sidewall pattern is formed by an etch-back process carried out on the second insulating layer.

* * * * *